United States Patent
Bajic et al.

(10) Patent No.: US 11,303,258 B1
(45) Date of Patent: Apr. 12, 2022

(54) METHOD AND SYSTEM FOR ADAPTIVE AUDIO FILTERS FOR DIFFERENT HEADSET CUSHIONS

(71) Applicant: Apple Inc., Cupertino, CA (US)

(72) Inventors: Vladan Bajic, San Francisco, CA (US); Jarrett B. Lagler, San Francisco, CA (US); Esge B. Andersen, Campbell, CA (US); Daniel S. Phillips, Los Angeles, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/023,275

(22) Filed: Sep. 16, 2020

(51) Int. Cl.
| | | |
|---|---|---|
| *H04R 1/10* | (2006.01) | |
| *H04R 3/00* | (2006.01) | |
| *G10K 11/178* | (2006.01) | |
| *H03G 5/16* | (2006.01) | |
| *H04R 3/02* | (2006.01) | |

(52) U.S. Cl.
CPC .............. *H03G 5/165* (2013.01); *H04R 3/02* (2013.01); *G10K 11/178* (2013.01); *H04R 1/1008* (2013.01)

(58) Field of Classification Search
CPC ...... H03R 1/10; H03R 1/1008; H03R 1/1016; H03R 1/1041; H03R 1/1066; H03R 1/1083; H04R 3/00; H04R 3/02; H04R 3/04; H04R 2420/07; H03G 5/165; H03G 5/16; G10K 11/178; G10K 11/1783; G10K 11/1787; G10K 11/17853
See application file for complete search history.

(56) References Cited

U.S. PATENT DOCUMENTS

| | | | |
|---|---|---|---|
| 10,805,703 B1* | 10/2020 | Bikumala | H04B 1/385 |
| 2007/0154046 A1* | 7/2007 | Mishan | H04R 1/1083 |
| | | | 381/370 |
| 2011/0280411 A1* | 11/2011 | Cheah | G10K 11/17821 |
| | | | 381/71.6 |
| 2017/0085988 A1* | 3/2017 | Hardi | H04R 1/1008 |
| 2021/0084402 A1 | 3/2021 | Terlizzi et al. | |

* cited by examiner

*Primary Examiner* — Thang V Tran
(74) *Attorney, Agent, or Firm* — Womble Bond Dickinson (US) LLP (57) ABSTRACT

A method performed by an audio system that includes a headset. The method identifies a cushion that is coupled to a headset housing of the headset in which a speaker is integrated therein, produces a reference microphone signal from a reference microphone of the headset, selects an active noise cancellation (ANC) filter based on the identified cushion, filters the reference microphone signal with the ANC filter to produce an anti-noise signal, drives the speaker with the anti-noise signal, in response to driving the speaker, produces an error microphone signal from an error microphone of the headset, and performs an adaptive ANC function to adapt the ANC filter based on the reference microphone signal and the error microphone signal.

22 Claims, 4 Drawing Sheets

METHOD AND SYSTEM FOR ADAPTIVE AUDIO FILTERS FOR DIFFERENT HEADSET CUSHIONS

FIELD

An aspect of the disclosure relates to an audio system that adapts audio filters for different headset cushions. Other aspects are also described.

BACKGROUND

Headphones are an audio device that includes a pair of speakers, each of which is placed on top of a user's ear when the headphones are worn on or around the user's head. Similar to headphones, earphones (or in-ear headphones) are two separate audio devices, each having a speaker that is inserted into the user's ear. Both headphones and earphones are normally wired to a separate playback device, such as an MP3 player, that drives each of the speakers of the devices with an audio signal in order to produce sound (e.g., music). Headphones and earphones provide a convenient method by which the user can individually listen to audio content without having to broadcast the audio content to others who are nearby.

SUMMARY

An aspect of the disclosure is a method performed by an audio system that includes an audio output device, such as an over-the-ear headset (or headphones). The audio system identifies a cushion that is coupled to a headset housing of the headset in which a speaker is integrated therein. For instance, the headset housing may include a (e.g., right) earcup on which the cushion may be removeably coupled. The system selects an active noise cancellation (ANC) filter based on the identified cushion. For example, the system may perform a table lookup using the identified cushion into a data structure that associates each of a plurality of ANC filters with at least one of a plurality of cushions. The system generates an anti-noise signal by filtering the reference microphone signal produced from a reference microphone of the headset with the selected ANC filter. The system drives the speaker with the anti-noise signal, and adapts the selected ANC filter based on the reference microphone signal and an error microphone signal produced by an error microphone of the headset.

In one aspect, the system may perform a hybrid adaptive ANC function that includes feedforward ANC and feedback ANC. For instance, the ANC filter may be a feedforward ANC filter and the anti-noise signal may be a first anti-noise signal. The system selects a feedback ANC filter based on the identified cushion, and generates a second anti-noise signal by filtering the error microphone signal with the feedback ANC filter. The system drives the speaker with a combination of the first anti-noise signal and the second anti-noise signal. In one aspect, while the system adapts the feedforward ANC function based on the reference microphone signal and the error microphone signal, the selected feedback ANC filter may remain fixed. In another aspect, the system performs a hybrid adaptive ANC function by adapting the feedforward ANC filter based on the reference microphone signal and the error microphone signal, and adapting the feedback ANC filter based on the error microphones signal. In another aspect, the system determines that the headset is being worn on a head of the user, and adapts the selected (e.g., feedforward) ANC filter in response to determining that the headset is being worn. In some aspects, the selected ANC filter is only adapted while the headset is worn on the head of the user.

In one aspect, the system obtains an input audio signal containing program audio (e.g., music). The system selects an equalization (EQ) filter based on the identified cushion, and generates a filtered input audio signal by filtering the input audio signal with the EQ filter, which the system uses in combination with the anti-noise signal to drive the speaker. In another aspect, the combination is a first combination and the error microphone signal is a first error microphone signal, the system identifies that a different cushion is coupled to the headset housing, and selects a different ANC filter and a different EQ filter based on the different identified cushion. The system generates 1) a different anti-noise signal by filtering the reference microphone signal with the different ANC filter and 2) a different filtered input audio signal by filtering the input audio signal with the different EQ filter. The system drives the speaker with a second combination of the different filtered input audio signal and the different anti-noise signal, and, while the different EQ filter remains fixed, adapts the different ANC filter based on the reference microphone signal and a second error microphone signal produced by the error microphone of the headset.

Another aspect of the disclosure is a method performed by the audio system that includes the headset in which an ambient sound enhancement (ASE) filter is selected based on the identified cushion. The ASE filter performs an ASE function for reproducing ambient sound (e.g., captured by the reference microphone) in a "transparent" manner, e.g., as if the headset was not being worn by the user. To perform the method, the system identifies the cushion is coupled to the headset housing of the headset in which a speaker is integrated therein. The method selects the ASE filter based on the identified cushion, and generates a filtered signal by filtering a reference microphone signal produced by the reference microphone in which at least one sound of the ambient environment that was captured by the reference microphone is selectively attenuated. The system drives the speaker with the filtered signal to cause the speaker to reproduce at least a portion of the sounds of the ambient environment.

The above summary does not include an exhaustive list of all aspects of the disclosure. It is contemplated that the disclosure includes all systems and methods that can be practiced from all suitable combinations of the various aspects summarized above, as well as those disclosed in the Detailed Description below and particularly pointed out in the claims. Such combinations may have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Many headsets, such as over-the-ear headphones, rely on cushions (or earpads) to improve user experience. A cushion is an outer structure that is connected to the headset, which when worn on a head of a user comes into direct contact with (e.g., abuts) at least a portion of the user's head. The cushion may be formed out of soft and flexible material (e.g., foam, silicone, rubber, plastic, etc.). In the case of over-the-ear headphones, a cushion may have a toroid shape, where the pad's material forms the perimeter of the toroid (e.g., with an empty space in the middle), such that when worn by a user, each cushion of the headphones (e.g., one for the user's left ear and one for the user's right ear) is arranged to abut a side of the user's head, while surrounding a respective ear of the user. The term "toroid" is used here more generically than a fully rounded surface of revolution, and instead may also refer to a generally ring shaped object that need not be circular, and instead could be ellipsoidal, rectangular or square. Cushions improve user experience by providing comfort and enhancing sound quality. For instance, Cushions provide padding to allow headphones to rest comfortably against a user's head. They may also enhance sound quality by (e.g., at least partially) acoustically sealing off the user's ear from the ambient environment when pressed up against the user's head. The cushions may press up against the user's head due to a flexible headband of the headphones that that flexes when the headphones are placed upon a user's head. This sealing may create passive noise cancellation that may reduce ambient noise within the environment from leaking into the user's ear. In addition, at least partial occlusion of the user's ear may amplify or increase some spectral content (e.g., low-frequency content) of user-desired sound (e.g., music) that is played back by the headphones.

Some headsets are designed to enable users to replace existing cushions with new ones. For instance, cushions over time may degrade or become damaged due to wear and tear. Since the internal components (e.g., speakers, etc.) of the headset may remain in relatively good condition, users may choose to replace cushions rather than purchase a new headset. Some users may opt to replace cushions with different ones for aesthetic or comfort reasons. For instance, some users may want large (or thick) cushions that may offer more comfort, while others may choose small (or thin) cushions that may be compact and easy to carry. Since cushions come in different shapes and sizes, their impact on sound quality may vary. In particular, bigger cushions that offer more comfort may conform better to a user's head (as oppose to less plush cushions), thereby better sealing off the user's ears from the ambient environment. As described herein, this seal may provide passive noise cancellation and increase low-frequency spectral content of sound playback. Smaller cushions, however, may not conform as easily as bigger cushions (e.g., because of less material), thereby leaving air gaps that would otherwise be sealed by the bigger cushions. These gaps may allow ambient noise to leak into the headset, which may adversely affect the user's sound experience. As a result, headset audio playback may sound differently (e.g., having different sound characteristics) to a user based on the headset's cushion(s).

Figure 1A:
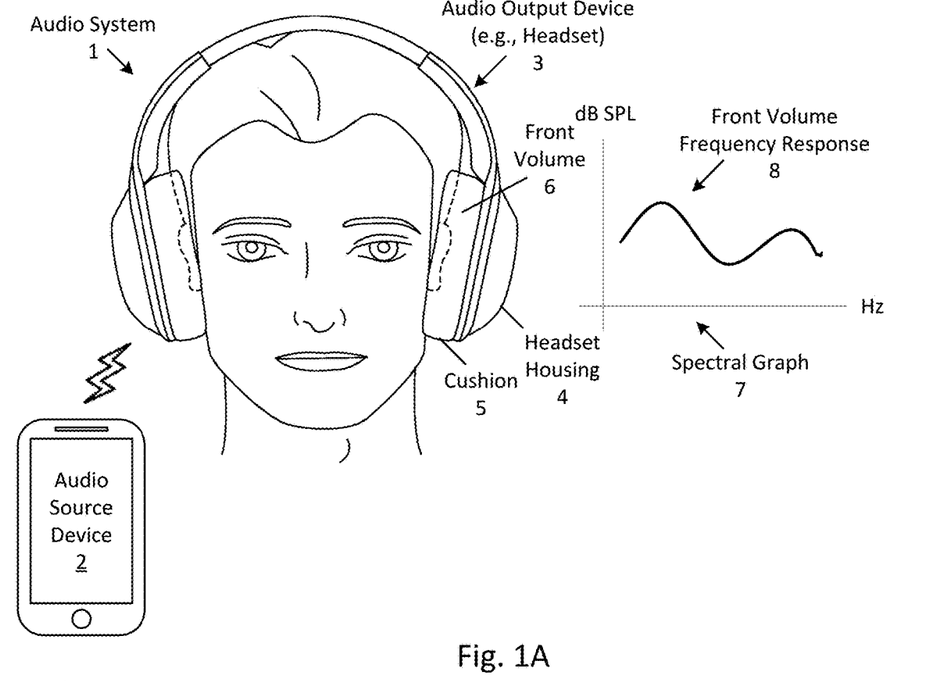
FIGS. 1A and 1B show changes in a front volume frequency response based on differences between different cushions coupled to a headset housing of a headset according to one aspect.
Figure 1B:
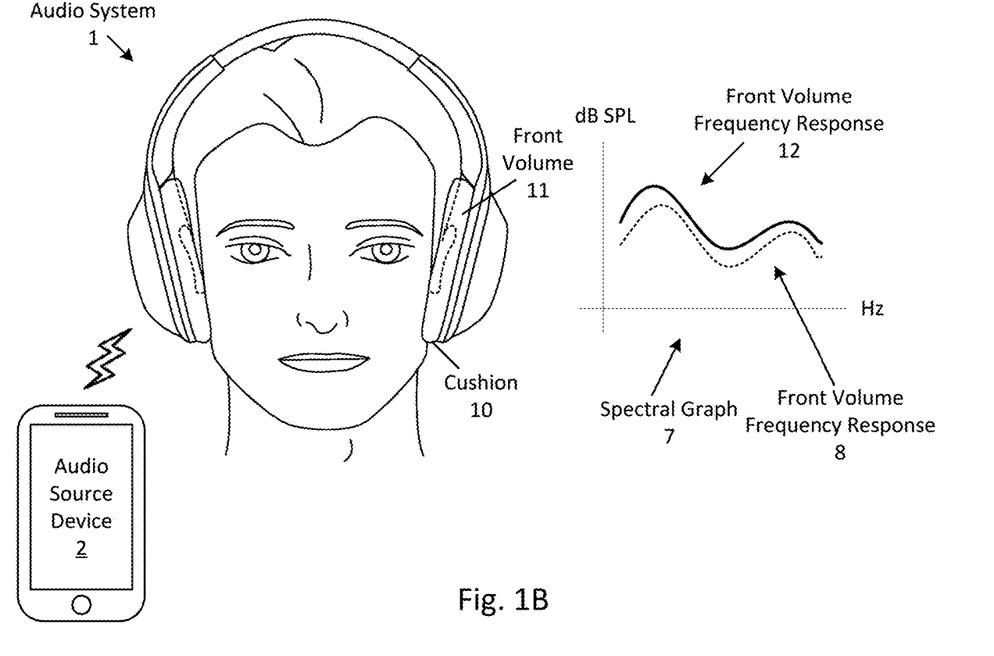

FIGS. 1A and 1B show changes in a front volume frequency response based on differences between different cushions coupled to a headset according to one aspect. Specifically, each figure illustrates an audio system 1 that includes an audio source device 2 and an audio output device 3, and a spectral graph 7 that illustrates the spectral features of the output device as sound energy or sound pressure level (dB SPL) in logarithmic form with respect to frequency. More about the spectral graph is described herein. In one aspect, the audio system may include other devices, such as a remote electronic server (not shown) that may be communicatively coupled to either the source device, the audio output device, or both. In one aspect, this remote electronic server may perform at least some of the operations described herein.

As illustrated, the audio output device 3 is a headset that is arranged to direct sound into the ears of the wearer. Specifically, the headset is an over-the-ear headset (or headphones) that is shown to be at least partially covering both the user's ears. The output device includes two headset housings 4 (a left headset housing and a right headset housing) that are both coupled together via a headband. In one aspect, the headset housings may slidably couple to the headband, such that each of the housings may move away from or towards the headband in order to accommodate the anthropometrics (e.g., head size) of a user. In some aspects, the output device may include only one headset housing (e.g., the left headset housing). The headset housing is arranged to (e.g., removeably) couple (or connect) to cushions that are designed to come into contact with the user when the output device is worn on the user's head. In one aspect, the headset housings may include at least some electronic components, such as at least one speaker (e.g., speaker 22 illustrated in FIG. 2) and/or at least one microphone (e.g., the reference microphone 20 and/or the error microphone 21 illustrated in FIG. 2) integrated therein.

In another aspect, the output device may be any electronic device that includes at least one speaker and is arranged to be worn by the user (e.g., on the user's head), and arranged to output sound by driving the speaker with at least one audio signal. Examples may include an on-the-ear headset or in-ear headset (or earphone).

The audio source device 2 is illustrated as a multimedia device, more specifically a smart phone. In one aspect, the source device may be any electronic device that can perform audio signal processing operations and/or networking operations. An example of such a device may include a tablet computer, a laptop, a desktop computer, a smart speaker, etc. In one aspect, the source device may be a portable device, such as a smart phone as illustrated. In another aspect, the source device may be a head-mounted device, such as smart glasses, or a wearable device, such as a smart watch.

As shown, the audio source device 2 is communicatively coupled to the audio output device 3, via a wireless connection. For instance, the source device may be configured to establish a wireless connection with the output device via any wireless communication protocol (e.g., BLUETOOTH protocol). During the established connection, the source device may exchange (e.g., transmit and receive) data packets (e.g., Internet Protocol (IP) packets) with the output device, which may include audio digital data. In another aspect, the source device may be coupled via a wired connection. In some embodiments, the audio source device may be a part of (or integrated into) the audio output device. For example, as described herein, at least some of the components (e.g., at least one processor, memory, etc.) of the audio source device may be a part of the audio output device. As a result, at least some (or all) of the operations to adapt audio filters for different headset cushions may be performed by the audio source device, the audio output device, or a combination thereof.

Returning to FIG. 1A, this figure shows an audio system 1 in which the output device 3 has a (first) cushion 5 coupled to each headset housing 4, which is a large (or thick) cushion that provides significant cushioning. For instance, the cushion may include a thick piece of (e.g., memory) foam that may be covered by at least one piece of material (e.g., leather, cloth, etc.). When worn by the user, a front volume 6 (or space) is formed between the cushion 5 (and the headset housing 4) and a portion of the user's head, which in the case of over-the-ear headphones includes at least a portion of the user's ear. In one aspect, cushion 5 may (at least partially) occlude or block the user's ear from the ambient environment, therefore (at least partially) isolating the front volume 6 from the outside environment.

Figure 2:
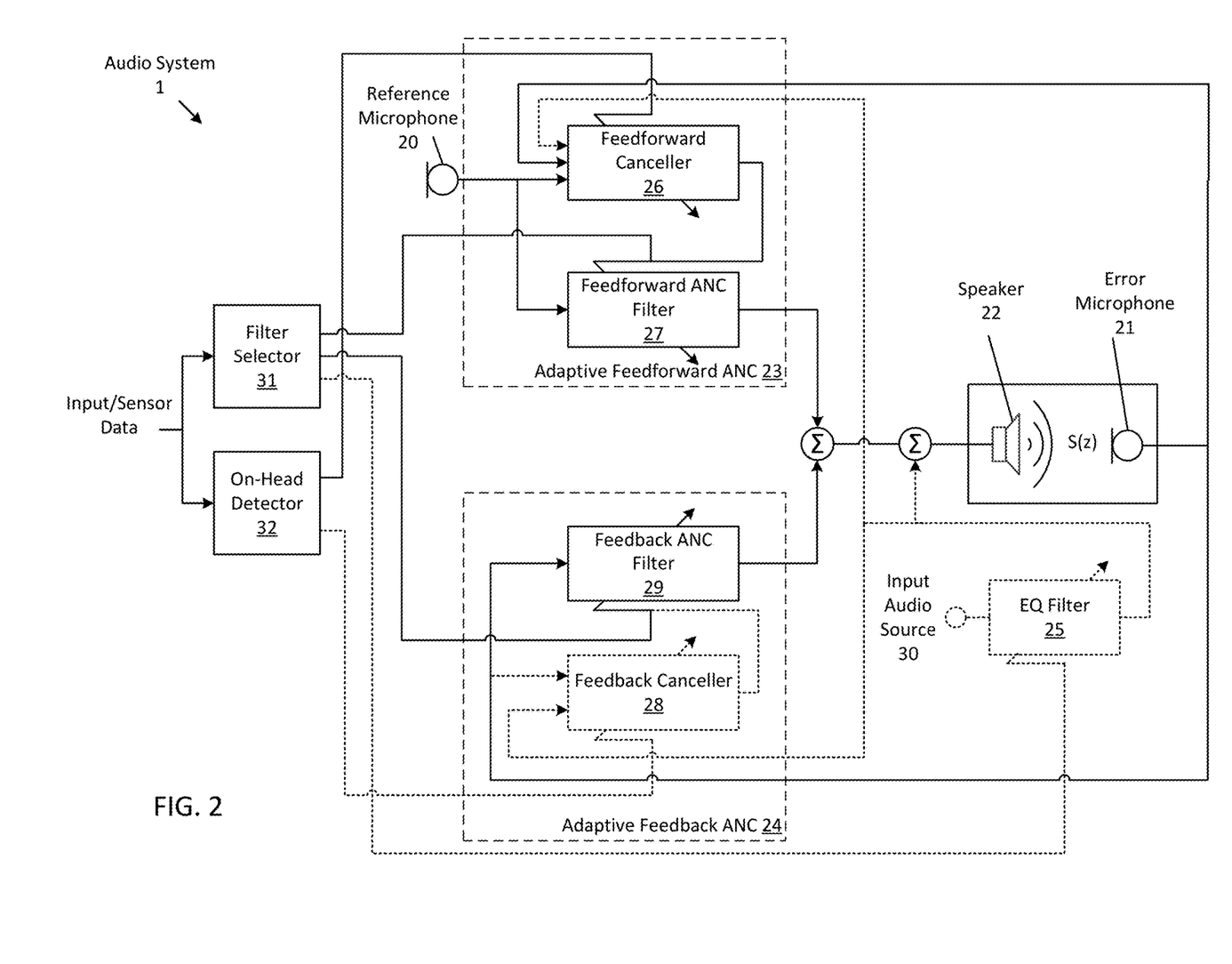
FIG. 2 shows a block diagram of the audio system that adapts one or more audio filters according to one aspect.

This figure also illustrates a spectral graph 7 that shows a frequency response 8 as sound energy (in dB sound pressure level (SPL)) with respect to frequency of the front volume that is formed (at least in part) by the cushion 5. In one aspect, the frequency response may represent the travel path between a sound source, such as a speaker (e.g., speaker 22 as shown in FIG. 2) integrated within the headset housing 4, and the user's ear (or ear canal). The frequency response represents how well (spectrally) sound is reproduced within the front volume. Thus, sound reproduced by a speaker of the headset housing may have certain sound characteristics, such as pitch, loudness, timbre, envelope, tone, etc.

In some aspects, the frequency response may be measured in response to a stimulus sound, e.g., an impulse or a suitable stimulus such as a since sweep being emitted by a speaker of the output device. A microphone (which is arranged to capture sound within the front volume, such as an error microphone) may capture the stimulus sound, and process the sound to measure the frequency response. In one aspect, the frequency response 8 may be a predefined response that is measured in a controlled setting (e.g., a laboratory).

FIG. 1B shows the audio output device 3 with a different (second) cushion 10 coupled to each headset housing 4, which are smaller (or thinner) than cushions 5 that are illustrated in FIG. 1A. In one aspect, in lieu of (or in addition to) size differences, cushions 10 and cushions 5 may have other differing characteristics. For example, cushions 5 may be formed of plusher material, while cushions 10 may be formed from stiffer material. As another example, both cushions may be covered with different materials (e.g., cushions 5 having a leather cover, which cushions 10 have a cloth cover).

As illustrated, while the output device 3 is worn with cushions 10, a front volume 11 is formed, which is different than the front volume 6 of FIG. 1A. In particular, since cushions 10 are thinner than cushions 5, the front volume 11 is less than front volume 6. As a result of the change in the front volume, the front volume frequency response has also changed. Specifically, the frequency response 12 of the front volume 11 (illustrated in the spectral graph) has slightly increased with respect to the frequency response 8. In one aspect, the change in the front volume frequency response may be the result of the reduced distance between the (e.g., speaker integrated within the) headset housing 4 and the user's ear, due to the cushion 10 being thinner then (or having a reduced thickness with respect to) the cushion 5. In another aspect, the change in front volume frequency response may (e.g., also) be the result of design differences between the cushions (e.g., their materials, etc.). The change in the frequency response (from response 8 to response 12) may cause changes to sound characteristics. As previously described, sound perceived by the user while wearing the headset 3 with the first cushions 5 may have certain sound characteristics, such as pitch, loudness, and tone. At least some of these characteristics, however, may change when the user replaces the first cushions 5 with the second cushions 10. For example, since the frequency response 12 has more low-frequency spectral content, sound produced while the headset 3 has cushions 10 may have more bass (higher low-frequency sound), than when the headset plays back the same audio with the first cushions, even though the volume stays the same. This may inadvertently degrade the user experience, since the same audio content (e.g., music) being played back by the headset may sound completely different between the two cushions.

The present disclosure describes an audio system 1 that is capable of adapting audio filters used by audio signal processing operations based on an identified cushion that is currently coupled to the headset housing in order to provide a consistent sound experience. Specifically, the audio system identifies a cushion that is coupled to a headset via a headset housing that has a speaker integrated therein. The system selects at least one audio filter based on the identified cushion, and applies the audio filter to one or more audio signal processing operations in order to equalize frequency responses between different cushions in order to keep sound output consistent. For example, one audio filter may be an active noise cancellation (ANC) filter for an ANC function that is configured to reduce or cancel noise from the ambient environment that leaks into the headset. The ANC function may reduce noise by filtering a reference microphone signal that contains sound of the ambient environment with the ANC filter to produce an anti-noise signal for playback by the headset's speaker. Since different cushions have varying degrees of passive noise cancellation, the amount of anti-noise necessary to reach a consistent reduction of ambient noise may vary. For instance, a small cushion may be associated with a first ANC filter that is used to produce a first anti-noise signal, while a large cushion may be associated with a second ANC filter that is used to produce a second anti-noise signal. Both signals may have varying degrees of spectral content, since both cushions may provide different passive noise cancellation (e.g., the second anti-noise signal may have less spectral content than the first anti-noise signal since the small cushion may provide less passive noise cancellation). As a result, the system may produce different anti-noise across different cushions in order to provide a consistent and similar reduction in noise. Thus, the audio system may be configured such that different (or similar) audio filters are selected and applied based on the identified cushions in order for sound characteristics to be the same (or similar) across different cushions. Thereby providing a consistent and pleasurable user experience.

Figure 3:
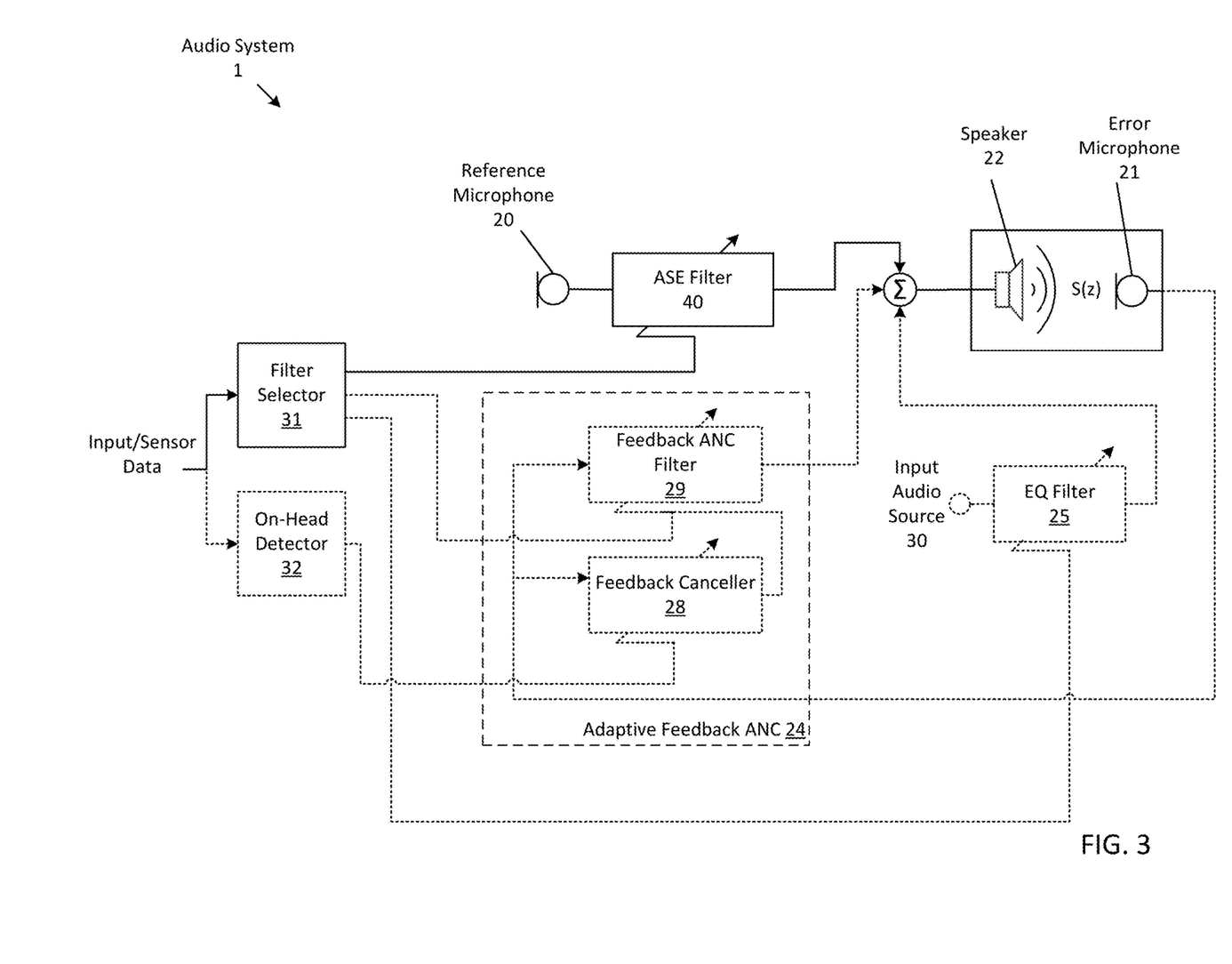
FIG. 3 shows another block diagram of the audio system that adapts one or more audio filters according to another aspect.

As described herein, FIGS. 2 and 3 show block diagrams of the audio system 1. The elements of the audio system shown in these figures and described below that perform audio digital signal processing operations may all be implemented (e.g., as software) as one or more programmed digital processors (generically referred to here as "a processor" that is to execute instructions stored in memory). For example, at least some of the operations described herein may be performed by a processor of the audio source device 2 and/or a processor of the audio output device 3. As another example, all of the operations may be performed by at least one processor of either device.

Turning now to FIG. 2, this figure shows a block diagram of the audio system 1 that adapts one or more audio filters according to one aspect. This diagram illustrates several computational blocks for performing adaptive audio filter operations in order to adapt audio filters according to an identified cushion coupled to the headset 3. In particular, this diagram illustrates the selection of one or more ANC filters and/or EQ filter(s). The system includes a reference microphone 20, an error microphone 21, a speaker 22, an adaptive feedforward ANC 23, an adaptive feedback ANC 24, an equalization (EQ) filter 25, an input audio source 30, a filter selector 31, and an on-head detector 32. In one aspect, the system may include less or more elements. For example, the system may include one or more reference (and/or error) microphones, one or more speakers, and/or one or more sensors.

The reference microphone 20 (and/or the error microphone 21) may be any type of microphone (e.g., a differential pressure gradient micro-electro-mechanical system (MEMS) microphone) that is arranged to convert acoustical energy caused by sound waves propagating in an acoustic environment into a microphone signal. In one aspect, the reference microphone may be an "external" microphone that is arranged to capture sound from the ambient environment as a (e.g., reference) microphone signal, while the error microphone may be an "internal" microphone that is arranged to capture sound (and/or sense pressure changes) inside a front volume formed between 1) a cushion and a headset's housing and 2) at least a portion of a user's head as a (e.g., error) microphone signal. Specifically, the error microphone picks up background sound that has leaked into this cavity that is formed between the user's ear and the inside of the cushion and headset housing. In one aspect, the error microphone may also pick up user-desired program audio (e.g., music, podcast, etc.) that is being emitted by the speaker 22 (which may be a part of the headset housing, as described herein). The speaker 22 may be an electrodynamic driver that may be specifically designed for sound output at certain frequency bands, such as a woofer, tweeter, or midrange driver, for example. In one aspect, the speaker 22 may be a "full-range" (or "full-band") electrodynamic driver that reproduces as much of an audible frequency range as possible.

The adaptive feedforward ANC 23 and the adaptive feedback ANC 24 are functions (operations) that are configured to produce (or generate) anti-noise in order to reduce (and/or cancel) ambient noise that leaks into the user's ear (e.g., through the seal formed between a cushion of a headset and a portion of the user's head) from the ambient environment. The feedforward ANC function 23 includes a feedforward canceller 26 and a feedforward ANC filter 27, and is configured to generate a (first) anti-noise signal based on sound captured in the ambient environment. Specifically, the feedforward ANC filter 27 is configured to receive (or obtain) a reference microphone signal produced from (or captured by) the reference microphone 20 that contains sound of an ambient environment in which a user wearing the headset is located. The feedforward ANC filter 27 is configured to generate the (first) anti-noise signal by filtering the reference microphone signal. In one aspect, the filter may be a finite-impulse response filter (FIR) or an infinite impulse response (IIR) filter. In another aspect, the filter may be a cascade of one or more filters, such as a low-pass filter, a band-pass filter, and/or a high-pass filter. In one aspect, the cascade of filters may be linear filters, such that the filters may be applied in any order to the reference microphones signal. In one aspect, the system may use the first anti-noise signal to drive the speaker 22 in order to produce anti-noise, as described herein.

The feedforward canceller 26 is configured to perform an adaptive feedforward ANC function to adapt the feedforward ANC filter 27 (e.g., W(z)) according to an estimate of a secondary path transfer function S(z) that represents the travel path between the speaker 22 and the error microphone 21. Specifically, the canceller 26 uses the reference microphone signal and the error microphone signal to adapt W(z) over time (e.g., during a phone call or other audio playback session) so that the "error" between the anti-noise and background sound, as picked up by the error microphone is reduced as much as possible. In one aspect, the canceller 26 may be in accordance with conventional techniques, executing for example an adaptive algorithm (e.g., Least Means Squares (LMS), Recursive Least Squares (RLS), etc.) to adapt W(z). For instance, the adaptive algorithm is used to find coefficients, w(n), of the filter that minimize an error in the destructive acoustic interference produced at the user's ear. Once found, the canceller 26 may adjust the existing coefficients of the filter according to new coefficients found as a result of the performance of the adaptive algorithm. In one aspect, the canceller 26 may perform the adaptive feedforward ANC function (e.g., by recalculating S(z)), at specific time intervals (e.g., every ten milliseconds, every twenty milliseconds, etc.).

The adaptive feedback ANC 24 includes a feedback canceller 28 and a feedback ANC filter 29, and is configured to produce a (second) anti-noise signal based on the background sound captured by the error microphone 21. Specifically, the feedback ANC filter 29 is configured to receive the error microphone signal and is generate the (second) anti-noise signal by filtering the error microphone signal. In one aspect, the filter 29 may be a similar (or the same) type of filter as the feedforward ANC filter (e.g., FIR or IIR filter). The feedback canceller 28 is configured to perform an adaptive feedback ANC function to adapt the feedback ANC filter 29 according to an estimate of the secondary path transfer function. The feedback canceller 28 obtains and processes the error microphone signal (e.g., according to an adaptive algorithm, as described herein) to determine (and adapt) a feedback ANC filter 29 in order to minimize the signal.

In one aspect, the system may perform the ANC functions described herein separately. In particular, the system may only perform the adaptive feedforward ANC function 23. Similarly, the system may only perform the adaptive feedback ANC function 24. In one aspect, when adapting one of the ANC functions (e.g., the feedforward ANC function 23), the system may fix the other ANC filter (e.g., feedback filter). More about fixing filters is described herein. Operations described herein relating to the selection of ANC filters and activation of adaptive ANC functions may correspond specifically to the ANC function 23 and/or the ANC function 24. In the case of both, the system may perform hybrid ANC, in which both functions are performed. When performing hybrid ANC, a combination of the first and second anti-noise signals produced by the feedforward ANC 23 and the feedback ANC 24, respectively, (e.g., the combination being the sum of both signals which) are used to drive the speaker 22. Otherwise, separate anti-noise signals may be used when either of the functions are performed without the other.

The filter selector 31 is configured to identify a cushion that is coupled to the headset housing(s) 4 of the headset 3, and is configured to select one or more audio filters according to an identified cushion. In this case, the selector is configured to select one or more ANC filters (e.g., the feedforward ANC filter 27 and/or the feedback ANC filter 29) based on the identified cushions. In some aspects, the selector may be configured to select other audio filters, such as one or more ASE filters and/or one or more EQ filters. More about selecting other audio filters is described herein.

The filter selector 31 is configured to obtain input data and/or sensor data, and from that data identify a cushion that is currently coupled to the headset housing 4. In aspect, the sensor data may be proximity sensor data produced by one or more proximity sensors (not shown) of the audio system, which the selector uses to identify the cushion (e.g., from several potential cushions). For example, the (e.g., headset housing 4 of the) headset 3 may include a Hall effect sensor that is configured to produce an output (e.g., voltage) signal (as sensor data) in response to sensing a magnetic field. The magnitude of the output signal produced by the sensor may be directly proportional to a sensed magnetic field strength. Thus, to identify cushions, each cushion may include one or more (unique) magnets with a unique magnetic field strength, with respect to magnets of other cushions. Once a cushion is coupled to the headset housing, the Hall effect sensor may sense the magnetic field produced by the cushion's magnet, and produce a unique output signal that corresponds to the magnet's unique magnetic field strength. From this signal the selector may identify the cushion. For example, the selector may perform a table lookup into a data structure using the signal that associates output signals of the Hall effect sensor with (e.g., unique identifiers associated with) cushions.

In another aspect, the headset may include one or more inductive sensors that are configured to produce an output signal (as sensor data) in response to sensing a changing magnetic field. In this case, as cushions with one or more (unique) magnets are being coupled to the headset 3, the inductive sensor may sense a change in the magnet's magnetic field as the magnets get closer to the sensor (e.g., while the user places the cushions into place on top of the headset housing). Since each of the magnets may have unique magnetic fields, the change sensed by the inductive sensors (and the resulting output signal) may be unique to the particular cushion. Thus, the filter selector 31 may use the detected change to identify the cushion (e.g., based on a table lookup as described herein).

In one aspect, the selector may identify the cushion using other sensor data, such as image data. For instance, the audio system 1 may include a camera (not shown) that is a part of the headset 3 (or the audio source device 2), and is arranged to produce image data that contains scenes of an environment that is within a field of view of the camera. In this case, the field of view may include at least a portion of the headset, such as the headset housing 4. The selector may perform an object recognition algorithm upon the image data to detect objects contained therein, such as cushions.

In some aspects, the sensor data may be obtained from a cushion that is coupled to the headset. Specifically, the headset may be arranged to establish a communication link with the cushion, and receive identifying information (e.g., a unique identifier) from the cushion. In one aspect, the communication link may be established upon the cushion being coupled to the (headset housing of the) headset. For example, the cushion may include a connector that electronically couples with another connector of the headset housing when the cushion is coupled to the housing. Once connected, electronics within the cushion may transmit the identifying information. As another example, the cushion may establish a wireless connection (via any wireless communication protocol, such as BLUETOOTH protocol) with the headset, and transmit the information via the connection. In one aspect, the cushion and headset may communicate via other communication technologies, such as radio-frequency identification (RFID). In this case, the cushion may include a RFID tag that contains the identifying information, and the headset may include a RFID reader. Once the cushion is within a threshold range of the reader, the tag may transmit the information. In one aspect, the RFID tag may be an active tag (e.g., self-powered), or a passive tag (e.g., powered by the RFID reader of the headset). In another aspect, the cushion may communicate via near-field communication (NFC). Similar to the RFID, the cushion may include a NFC tag from which a reader of the headset receives identifying information when the tag is within a threshold range. In another aspect, the system may use any wireless communication method to receive identifying information from the cushion.

In one aspect, the filter selector 31 may obtain input data that includes the identifying information of a cushion that is (or is going to be) coupled to the headset. Specifically, the input data may be user-input data that is received by the audio source device. For example, the user may perform a user-selection of a graphical user interface (GUI) item associated with the cushion that is in a user interface (UI) being displayed on a touch-sensitive screen of the audio source device. Once selected, the identifying information associated with the GUI item may be transmitted to the filter selector 31 as the input data. In another aspect, the input data may be received via other methods, such as via a voice command that is captured by one or more microphones (e.g., the reference microphone 20).

In one aspect, the sensor data may be acoustic data (e.g., one or more microphone signals). In this case, the filter selector may identify a cushion that is coupled to the headset based on the one or more microphone signals. For example, the audio system 1 may measure a frequency response of the front volume of the headset, and identify the cushion based on the frequency response. As described herein, the front volume frequency response may change based on the cushion that is coupled to the headset. To measure the frequency response, the system may output a test audio signal (e.g., an impulse, a sine sweep, etc.) through the speaker 22. In response, the error microphone 21 may capture sound that includes the impulse, and the filter selector may use the error microphone signal to measure the frequency response. To identify the cushion, the selector may perform a table lookup into a data structure that associates frequency responses with different cushions. In one aspect, the frequency response may be measured while the headset is being worn by the user.

The filter selector 31 may be configured to perform a table lookup into a data structure that associates identifying information of one or more cushions with one or more audio filters, using the received identifying information (e.g., of a cushion that is currently coupled to the headset) In one aspect, to identify the one or more audio filters, the selector may use the input and/or sensor data to perform the table lookup, rather than using the identifying information. For example, the selector may use a measured frequency response to perform a table lookup into a data structure that associates frequency responses (of different headset front volumes formed by different cushions) with one or more audio filters. Once the one or more audio filters are identified within the data structure, the selector selects the audio filters. For example, the selector may select the feedforward ANC filter 27, the feedback ANC filter 29, or both. In one aspect, the selected ANC filters may include one or more filter coefficients that are associated with the ANC filters. In another aspect, the selected filters may include one or more filters that are applied by either ANC filter. As described herein, the ANC filters may include a cascade of one or more linear filters (e.g., a low-pass filter, a band-pass filter, etc.). In one aspect, the filter selector 31 may select at least one of these filters that are in the cascade. In some aspects, the data structure may associate filter characteristics with identifying information. For example, the data structure may indicate the ANC filter's cutoff frequency. As another example, the data structure may indicate a (e.g., secondary path) transfer function of an ANC filter that is associated with a corresponding cushion. In this case, secondary path transfer functions may change between different cushions because of differences within front volumes that correspond to the cushions. Thus, the filter selector may select one or more of these filter characteristics in order to set (or configure) the audio system's filters characteristics accordingly. In one aspect, the selection of the filters may be based on which ANC functions are executing (or are to be executed) by the audio system 1. In another aspect, the selector may select filters regardless of whether the filters are (currently being) executed by the audio system. The filter selector 31 is configured to transmit the selected filters (e.g., one or more filter coefficients, filter characteristics, etc.) to the feedforward ANC filter 27 and/or the feedback ANC filter 29, such that the ANC filters are configured according to the selected filters. In one aspect, once the ANC filters 27 and/or 29 are configured, each of the filters may are configured to produce a respective anti-noise signal for output by the speaker 22.

The on-head detector 32 is configured to obtain input data and/or sensor data, and is configured detect (determined) whether the headset 3 is being worn on the head of the user based on the data. For example, the data may be proximity sensor data that is received from one or more proximity sensors. As another example, the detector may measure a front volume frequency response of the headset, and from the measured frequency response determine whether the headset is being worn by the user. In one aspect, the on-head detector may use any method to determine whether the headset is currently being worn by the user.

In one aspect, the on-head detector 32 may determine that the headset 3 is being worn by the user in response to receiving input data. For instance, the input data may be user-input data that indicates a user request for activating the one or more audio signal processing operations, such as ANC functions (e.g., based on a user-selection of a GUI item in a UI that is displayed on the audio source device 2, as described herein). In another aspect, the input data may be received in response to powering up the audio source device 2 and/or the headset 3. In another aspect, the detector may determine that the headset is being worn (or is to be worn) by the user in response to receiving a user-request to playback program audio (e.g., music, a podcast, a movie soundtrack, etc.). More about playing back program audio is described herein.

In one aspect, the on-head detector 32 is configured to activate one or more audio signal processing operations upon detecting that the headset 3 is being worn on the head of the user. For instance, upon detecting that the headset is being worn (e.g., based on the proximity sensor data), the detector may activate the ANC functions, such that the headset begins to output anti-noise. Specifically, once detected, the detector may transmit a control signal to (e.g., at least one of) the ANC functions 23 and 24, such that one or more anti-noise signals are produced. For example, the feedforward ANC filter (which has been configured by the filter selector 31) may receive the reference microphone signal from the reference microphone and filter the signal to produce the first anti-noise signal. Similarly, the feedforward ANC filter 29 (which has been configured by the filter selector 31) may receive the error microphone signal from the error microphone 21 and filter the signal to produce the second anti-noise signal. Both signals may be summed to produce a combination of both signals, which is then used to drive the speaker 22. In one aspect, the filters 27 and 29 may be the filters that were selected by the filter selector 31.

In one aspect, the on-head detector 32 is configured to activate the adaptive feedforward ANC 23 and/or the adaptive feedback ANC 24, upon detecting that the headset is being worn. Specifically, the on-head detector may transmit control signals to the feedforward canceller 26 and the feedback canceller 28, which in response may begin performing adaptive ANC operations to adapt the ANC filters, as described herein. In one aspect, the adaptive ANC functions may begin adapting their respective ANC filters, which are selected by the filter selector 31, as described herein. Thus, the selected filters are adapted in response to determining that the headset is being worn. Once activated, the ANC filters 27 and 28 may produce their respective anti-noise signals using the filters selected by the filter selector 31, which are then used to drive the speaker 22. In response to driving the speaker, the error microphone 21 produces the error microphones signal, which is transmitted to the adaptive ANC functions, which in turn begin adapting those filters using the reference microphone signal and error microphone signal, as described herein. Specifically, the adaptive feedforward function is performed to adapt the feedforward ANC filter based on the reference microphone signal and the error microphone signal, while the adaptive feedback function is performed to adapt the feedback ANC filter based on the error microphone signal. Thus, the adaptive feedforward ANC 23 may use the feedforward ANC filter 27 selected by the filter selector as an initial filter and the adaptive feedback ANC 24 may use the feedback ANC filter selected by the filter selector as an initial filter, from which each of the adaptive ANC functions adapt.

In one aspect, at least one of the ANC filters may remain fixed while the headset is worn by the user. In another aspect, at least one of the ANC filters may remain fixed while the other ANC filter is adapted by its corresponding canceller. For example, the feedback ANC filter 29 may remain fixed while the feedforward ANC filter 27 (which was initially selected by the filter selector 31) is adapted by the feedforward canceller 26. Thus, in one aspect the feedback canceller 28 may be optional (as illustrated in this figure by having dotted boundaries).

In one aspect, the adaptive ANC functions 23 and 24 are only performed by the audio system (e.g., remain active), while the headset is worn on the head of the user. Specifically, once the on-head detector 32 detects that the headset is removed from the head of the user (e.g., the proximity sensor data indicates that the object has moved away from the headset past a threshold distance over a period of time), the detector 32 may transmit control signals to the cancellers 26 and 28 to cease adapting the ANC filters. In particular, the cancellers may pause (or freeze) adapting the ANC filters, such that the filters remain unchanged (from the last time the cancellers had adapted the ANC filters) until the on-head detector detects that the headset is once again being worn by the user. In one aspect, along with ceasing to adapt the ANC filters, the ANC functions 23 and 24 may cease producing their respective anti-noise signals, once it is determined that the headset has been removed. In addition, the audio system may cease (or pause) performing other audio processing operations (e.g., playing back program audio), in response to detecting that the headset has been removed. In some aspects, if the on-head detector determines that the headset is again being worn by the user, the detector may transmit control signals to the cancellers, instructing them to continue adapting the ANC filters. In another aspect, the ANC filters 27 and 29 be set back to the filters that were selected by the filter selector 31 when it is determined that the headset is being worn again by the user. In addition, the audio system may continue performing the audio signal processing operations that were previously paused (e.g., may continue playing back the program audio and outputting the anti-noise).

The input audio source 30 may include a programmed processor that is running a media player software application and may include a decoder that is producing an input audio signal as digital audio input. In one aspect, the input audio signal may include user-desired program audio (e.g., music). In another aspect, the programmed processor may be a part of the audio source device 2 and/or the audio output device 3, such that the media player is executed within the device. In another aspect, the media player may be executed by (e.g., one or more programmed processors of) another electronic device. In this case, the electronic device executing the media player may (e.g., wirelessly) transmit the input audio signal to the audio source device. In some aspects, the decoder may be capable of decoding an encoded audio signal, which has been encoded using any suitable audio codec, such as, e.g., Advanced Audio Coding (AAC), MPEG Audio Layer II, MPEG Audio Layer III, or Free Lossless Audio Codec (FLAC). Alternatively, the input audio source 30 may include a codec that is converting an analog or optical audio signal, from a line input, for example, into digital form for the controller. Alternatively, there may be more than one input audio channel, such as a two-channel input, namely left and right channels of a stereophonic recording of a musical work, or there may be more than two input audio channels, such as for example the entire audio soundtrack in 5.1-surround format of a motion picture film or movie. In one aspect, the input source 30 may provide a digital input or an analog input.

As described herein, the input audio signal may contain program audio, such as music, a podcast, or a movie soundtrack. In one aspect, the input audio signal may include other audio content. For example, the input audio signal may include a downlink signal that is obtained by the audio system during a telephone call with another electronic device.

In one aspect, the system may select other filters based on the identified cushion, such as the EQ filter 25. The EQ filter 25 is configured to obtain (at least one) input audio signal containing program audio (e.g., a musical composition, etc.) from the input audio source 30, and is configured to perform equalization functions (operations) thereon. Specifically, the EQ filter generates a filtered input audio signal by filtering the input audio signal, which is then used to drive the speaker 22 to output program audio contained therein. In one aspect, the EQ filter may be any digital filter that is configured to perform equalization operations, such as spectrally shaping at least some spectral components of the input audio signal. For example, the EQ filter may include one or more audio signal filters, such as a low-pass filter, a high-pass filter, etc. In some aspects, the EQ filter may be a cascade of one or more filters. In another aspect, the EQ filter may be a linear or a nonlinear filter.

In one aspect, the EQ filter 25 is selected by the filter selector 31 based on the identified cushion, as described herein. For example, the system may include a data structure that associates one or more EQ filters (and/or filter characteristics) with one or more cushions. Once selected, the audio system 1 may configure the EQ filter 25 according to the selected filter (and/or filter characteristics). The EQ filter is then configured to filter the input audio signal to produce a filtered input audio signal. In one aspect, the audio system may filter the input audio signal based on whether the on-head detector 32 determines that the headset is being worn by the user. For instance, once determined, the EQ filter 25 may begin filtering the input audio signal, which may then be used to drive the speaker 22. In one aspect the EQ filter may be optional (as illustrated in this figure by having dotted boundaries).

Thus far, the operations of the EQ filter 25 and the ANC functions have been described separately. In one aspect, the system may perform the operations separately or in combination. For instance, the system may perform ANC functions without performing equalization functions (e.g., while the input audio source 30 is not providing at least one input audio signal). As another example, the system may perform both functions contemporaneously. When performing both operations, the system drives the speaker 22 with a combination of the anti-noise signal (of both or at least one ANC function) and the filtered input audio signal. In addition, the feedback canceller 28 and the feedforward canceller 26 may receive the filtered input audio signal from the EQ filter 25 and process the filtered audio signal with the error microphone signal (or the combination of the error microphone signal and the reference microphone signal) to adapt their respective ANC filters. Specifically, both cancellers may compensate for the presence of the filtered input audio signal within the error signal (e.g., removing portions of the filtered input audio signal from the error microphone signal).

In one aspect, the EQ filter 25 may remain fixed (being the selected filter by the filter selector 31). For example, the system may adapt the (e.g., feedforward filter 26) based on the reference microphone signal and the error microphone signal, while the EQ filter remains fixed.

FIG. 3 shows a block diagram of the audio system 1 that adapts audio filters according to another aspect. In particular, this diagram illustrates the selection of one or more ambient sound enhancement (ASE) filters, ANC filters, and/or EQ filters. This system includes the reference microphone 20, the speaker 22, the filter selector 31, the on-head detector 32, one or more ASE filters 40, one or more EQ filters 25, the adaptive feedback ANC 24, and the input audio source 30. In one aspect, the system 1 may include one or more additional operational blocks, such as blocks illustrated FIG. 2. The ASE filter is configured to perform an ASE function for reproducing ambient sound (e.g., captured by an external microphone) in a "transparent" manner, e.g., as if the headset was not being worn by the user. The ASE filter is configured to obtain a reference microphone signal (that contains ambient sound) from the reference microphone 20, and filter the signal to reduce acoustic occlusion due to the cushion (and headset housing to which the cushion is coupled) of the headset covering the user's ear. In particular, the ASE filter may produce a filtered signal in which at least one sound of the ambient environment is selectively attenuated, such that the attenuated sounds are not reproduced by the speaker 22. In one aspect, the filter 40 may fully attenuate (e.g., duck) one or more sounds, or the sounds may be partially attenuated such that an intensity (e.g., volume) of the sound is reduced (e.g., by a percentage value, such as 50%). For instance, the filters may reduce a sound level of the microphone signal. In one aspect, the ASE filter may be composed of a cascade of digital filters that spectrally shape the ambient sound pickup channel for purposes of different types of noise suppression, e.g., microphone noise, background noise, and wind. In addition, the cascade of digital filters may include blocks that perform dynamic range compression and spectral shaping that are tuned for compensating the user's hearing loss.

In one aspect, the ASE filter may also preserve the spatial filtering effect of the wear's anatomical features (e.g., head, pinna, shoulder, etc.). In one aspect, the filter may also help preserve the timbre and spatial cues associated with the actual ambient sound. Thus, in one aspect, the filter may be user specific according to specific measurements of the user's head. For instance, the system may determine the filter according to a head-related transfer function (HRTF) or, equivalently, head-related impulse response (HRIR) that is based on the user's anthropometrics.

In one aspect, the ASE filter 40 may be selected by the filter selector 31 based on an identified cushion that is coupled to (the headset housing of) the headset, as described herein. In one aspect, selecting the ASE filter may include selecting one or more filter coefficients and/or one or more filter characteristics (e.g., cutoff frequency) of the ASE filter and/or selecting one or more digital filters that make up the cascade of filters, as described herein. In another aspect, the selection may correspond to a transfer function from which the audio system may derive the ASE filter. The filter selector 31 may configure the ASE filter 40 according to the selection.

In one aspect, the audio system 1 may perform the ASE function (e.g., filter the reference microphone signal with the ASE filter to produce a filtered signal in which at least one sound of the ambient environment is selectively attenuated) in response to the on-head detector 32 determining that the headset is being worn by the user, as described herein. In particular, in response to detecting that the headset is being worn, the system may filter the reference microphone signal to produce the filtered signal, and use the filtered signal to drive the speaker 22 to cause the speaker to reproduce at least a portion of the sounds of the ambient environment that were picked up by the reference microphone 20. In some aspects, the audio system 1 may perform the ASE function in response to a user-request, as described herein.

As shown, the system 1 also (optionally) includes the adaptive feedback ANC 24, the input audio source 30, and the EQ filter 25. The system may perform at least one of adaptive feedback ANC feedback operations upon an error microphone signal, equalization operations upon an input audio signal and/or perform the ASE function, such that the system drives the speaker 22 with a combination of one or more filtered signals produced by the ASE filter 40, one or more filtered input audio signals produced by the EQ filter, and/or one or more anti-noise signals.

In one aspect, one or more filters may remain fixed while the headset is worn on the head of the user, as described herein. For example, upon determining that the headset is being worn by on a head of the user, the EQ filter 25, the ASE filter 40 and/or the feedback ANC filter 29 may be fixed (e.g., being the filters that are selected by the filter selector 31).

In one aspect, the audio systems of FIGS. 2 and 3 may operate in one of several audio output modes. For example, the system may include an ANC mode (first mode) in which the system performs adaptive ANC operations, as described in FIG. 2 in order to produce one or more anti-noise signals for driving the speaker 22. The system may include an ASE mode (second mode) in which the system performs ASE operations by applying one or more ASE filters 40 to one or more reference microphone signals. in order for the headset to operate in a transparent manner, as described in FIG. 3. The system may also include an EQ mode (third mode) in which the system performs equalization operations upon an input audio signal that contains program audio by applying one or more EQ filters 25. In one aspect, the system may perform one of these modes at a time. In another aspect, the system may perform one or more modes at the same time. For example, the system may operate in the ANC mode and the EQ mode; or may operate in the ASE mode and the EQ mode, based on whether the audio system is playing back an input audio signal with program audio.

In some aspects, the audio system may operate in one or more of the audio output modes based on a user-request. For example, the system may receive a user-request, such as a user-selection of one or more GUI items, each GUI item associated with one of the audio output modes, in a UI displayed on the screen of the audio source device 2. Once an item is selected, the audio source device may transmit a control signal to one or more processors (e.g., of the source device and/or the headset) in order to perform (or activate) the associated operations. In one aspect, the audio system may perform equalization operations based on a user-request to playback user-desired program audio, such as music, a podcast, each. In some aspects, the audio system may switch between audio output modes in real-time, based on one or more user-requests. For example, the audio system may operate in the ANC mode and EQ mode in accordance to a first user-request. After which, the system may receive a second user-request for the system to operate in the ASE mode. In response, the system may pause (or cease) operating in the ANC mode (and/or EQ mode), and begin operating in the ASE mode.

Figure 4:
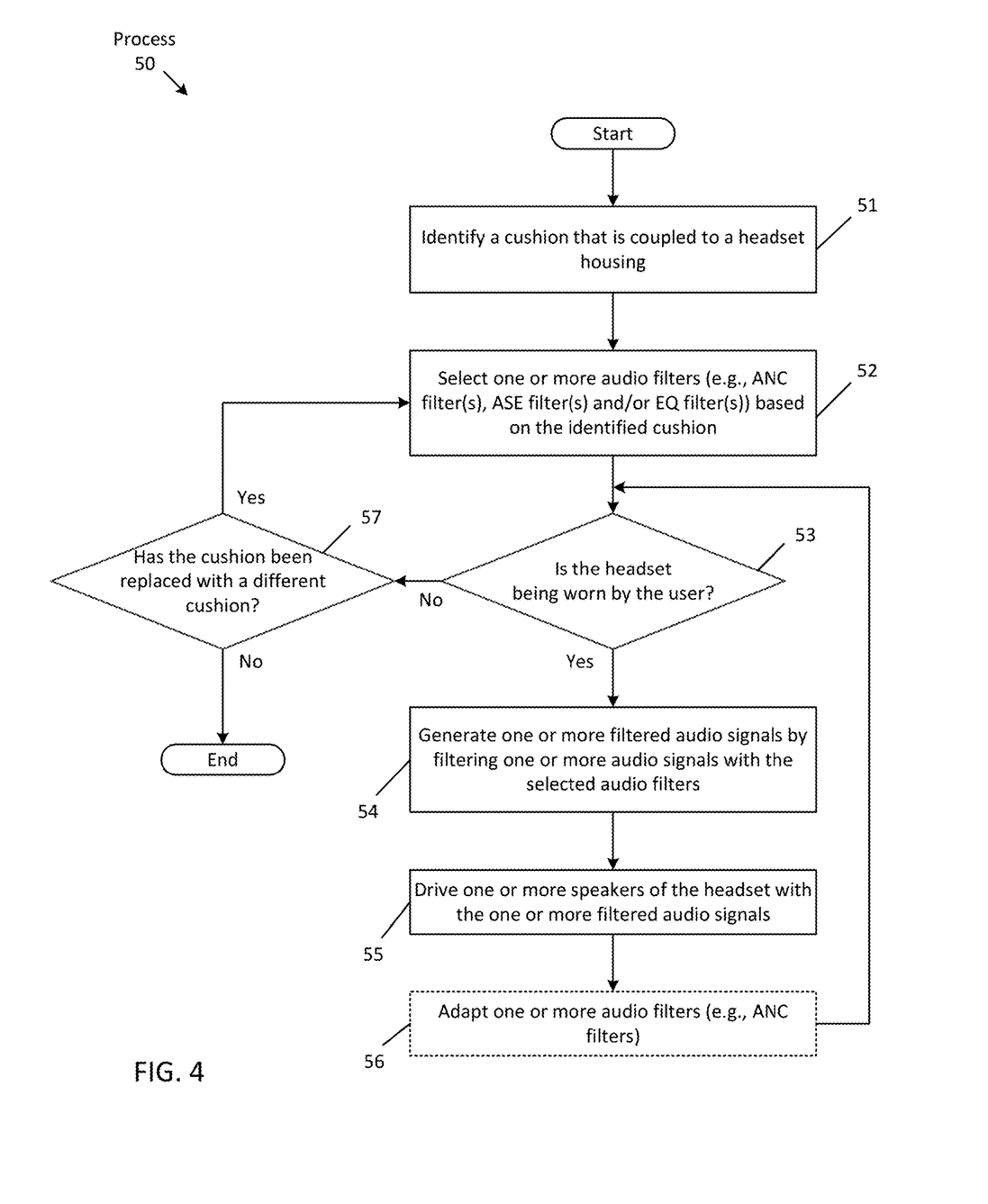
FIG. 4 is a flowchart of one aspect of a process to adapt one or more audio filters based on an identified cushion that is coupled to the headset housing.

FIG. 4 is a flowchart of one aspect of a process 50 to adapt one or more audio filters based on an identified cushion that is coupled to the headset housing. In one aspect, the process 50 is performed by one or more processors of (e.g., the audio source device 2 and/or the audio output device 3 of) the audio system 1. Thus, this figure will be described with reference to FIGS. 1-3.

The process 50 begins by identifying a cushion that is coupled to a headset housing 4 of a headset 3 (at bock 51). For instance, the filter selector 31 may obtain input data and/or sensor data, and identify a cushion that is coupled to the headset housing based on that data. In one aspect, the filter selector 31 may perform this identification once the cushion is manually coupled by the user to the housing. In another aspect, the filter selector may perform these operations once the headset 3 (and/or an audio source device coupled to the headset) is activated (e.g., powered up). The process 50 selects one or more audio filters (e.g., ANC filter(s), ASE filter(s), and/or EQ filter(s)) based on the identified cushion (at block 52). Specifically, the filter selector 31 may use identifying information (e.g., a unique identifier) associated with the identified cushion to select the audio filters associated with the cushion. In one aspect, the filter selector 31 may select each of the audio filters based on the identified cushion. As described herein, the selector may perform a table lookup into a data structure that associates identifying information with the filters. In one aspect, audio filters may be selected based on whether the audio system is performing associated operations. For example, if the audio system is to perform ANC operations, but not playback program audio, the filter selector may select the ANC filters, but not the EQ filters (or the ASE filters).

The process 50 determines whether the headset 3 is being worn by the user (at decision block 53). As described herein, the on-head detector 32 is configured to perform this determination based on obtained input data and/or sensor data. If so, the process 50 generates one or more filtered audio signals by filtering one or more audio signals with the selected audio filters (at block 54). For example, the system 1 may generate a first anti-noise signal by filtering one or more reference microphone signals with the feedforward ANC filter 27, and/or may generate a second anti-noise signal by filtering one or more error microphone signals with the feedback ANC filter 29. The process 50 drives one or more speakers of the headset with one or more filtered audio signals (at block 55). Continuing with the previous example, the system drives the speaker 22 with a combination of an anti-noise signal produced by the ANC filter 27 and another anti-noise signal produced by the ANC filter 29.

The process 50 adapts one or more audio filters, such as the ANC filters described herein (at block 56). Specifically, the system may perform the adaptive feedforward ANC function 23 and/or the adaptive feedback ANC function 24, based on a produced error microphone signal. The process 50 then returns back to decision block 53 to determine if the headset is still being worn by the user. If so, the operations of blocks 54-56 may be repeated. Otherwise, the process 50 proceeds to determine whether the cushion has been replaced with a different (second cushion) (at decision block 57). In one aspect, the system may perform similar operations that were performed at block 51. Specifically, the system may determine that a different cushion is coupled to the headset based on whether the filter selector 31 identifies different identifying information than was previously identified. If so, the process 50 returns to block 52 to select filters based on the different identified cushion. In the case of ANC filters, different ANC filters may be selected (which are associated with the different cushion), and the process may perform operations in blocks 54-55 to generate different anti-noise signals to be used to drive the speaker, as described herein. The different filters may also be adapted, as described in block 56.

As described herein, the process 50 enables the audio system 1 to equalize front volume frequency responses of a headset between different headset cushions. For example, the process 50 may identify a first cushion (e.g., cushion 5 in FIG. 1) that is coupled to (e.g., each headset housing of) the headset. This first cushion may form a first front volume while the cushion is coupled to the headset housing and the headset is being worn by the user. This first front volume may have a first frequency response, which in response to a sound (e.g., while driving the speaker 22) may produce one or more (first) sound characteristics (e.g., timbre, tone, loudness, etc.). When a different (second) cushion is coupled to the headset, a second (different) front volume may be formed. This second front volume may have a second (different) frequency response, which in turn may have different sound characteristics. The process 50 is configured to equalize the frequency responses by adapting the one or more audio filters, as described herein. In one aspect, the second cushion's frequency response may be equalized to match (e.g., within a tolerance) the first cushion's frequency response (and/or vice a versa). In another aspect, both frequency responses may be equalized to an average frequency response.

As a result of adapting audio filters, one or more sound characteristics across different cushions may be the same or similar. In other words, the headset may have a consistent sound profile between different cushions. For example, the system may produce a first error microphone signal that contains sounds produced by the headset's speaker while the first cushion is coupled to the headset housing, which include several first sound characteristics based on the first cushion's frequency response. The system may also produce a second error microphone signal that contains sounds produced by the headset's speaker while the second cushion is coupled to the headset housing, which include several second sound characteristics based on the second cushion's frequency response. The adaptation of the audio filters causes at least one sound characteristic shared between sounds contained within both microphone signals being the same (e.g., the sounds having the same timbre, tone, loudness, etc.).

In some aspects, however, rather than equalizing frequency responses, the one or more audio filters may be adapted to adjust spectral content of a cushion's frequency response in order for it to be different than at least one other cushion's frequency response. As a result, the system may adapt the audio filters so that the headset has different sound characteristics between different cushions.

Some aspects may perform variations to the process 50 described FIG. 4. For example, the specific operations of at least some of the processes may not be performed in the exact order shown and described. The specific operations may not be performed in one continuous series of operations and different specific operations may be performed in different aspects. For example, the operations of blocks 51 and/or 52 may be performed in response to determining that the headset is being worn by the user. Thus, once the audio system determines that the headset is being worn, the system may identify a cushion that is coupled to the headset housing.

In some aspects, the at least some of the operations described in this process may be adjusted (or adapted) according to which audio output mode the system 1 is currently operating. For example, when in the ANC mode, at least some of the operations may be performed to select and/or adapt one or more ANC filters, as described herein. On the other hand, when in the ASE mode, at least some of the operations may be performed to select (and/or adapt) one or more ASE filters, EQ filters, and/or (feedback) ANC filters, as described herein.

In one aspect, at least some of the operations of the process 50 may be performed by a machine learning algorithm that is configured to adapt one or more audio filters based on an identification of a cushion that is coupled to a headset. In another aspect, the machine learning algorithm may include one or more neural networks (e.g., convolution neural networks, recurrent neural networks, etc.) that are configured to obtain a fit parameter for an ear tip and determine whether the ear tip is best suited (or most optimal) for a particular user.

In one aspect, at least some of the operations described herein are operational operations that may or may not be performed. Specifically, blocks that are illustrated as having dashed or dotted boundaries may optionally be performed. For example, the operations relating to the input audio source 30 and/or the EQ filter 25 may not be performed in FIGS. 2 and 3. In another aspect, other operations described in relation to other blocks may be optional as well.

Personal information that is to be used should follow practices and privacy policies that are normally recognized as meeting (and/or exceeding) governmental and/or industry requirements to maintain privacy of users. For instance, any information should be managed so as to reduce risks of unauthorized or unintentional access or use, and the users should be informed clearly of the nature of any authorized use.

As previously explained, an aspect of the disclosure may be a non-transitory machine-readable medium (such as microelectronic memory) having stored thereon instructions, which program one or more data processing components (generically referred to here as a "processor") to perform the network operations, audio signal processing operations, and adaptive audio filter operations, as described herein. In other aspects, some of these operations might be performed by specific hardware components that contain hardwired logic. Those operations might alternatively be performed by any combination of programmed data processing components and fixed hardwired circuit components.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A method performed by an audio system that includes a headset, the method comprising:
   identifying a cushion that is coupled to a headset housing of the headset in which a speaker is integrated therein;
   selecting an active noise cancellation (ANC) filter based on the identified cushion;
   generating an anti-noise signal by filtering a reference microphone signal produced from a reference microphone of the headset with the selected ANC filter;
   driving the speaker with the anti-noise signal; and
   adapting the selected ANC filter based on the reference microphone signal and an error microphone signal produced by an error microphone of the headset.

2. The method of claim 1, wherein the ANC filter is a feedforward ANC filter and the anti-noise signal is a first anti-noise signal, wherein the method further comprises:
   selecting a feedback ANC filter based on the identified cushion;
   generating a second anti-noise signal by filtering the error microphone signal with the feedback ANC filter; and
   driving the speaker with a combination of the first anti-noise signal and the second anti-noise signal.

3. The method of claim 2, wherein the feedback ANC filter remains fixed while the selected feedforward ANC filter is adapted.

4. The method of claim 2, wherein adapting the selected ANC filter comprises:
   adapting the feedforward ANC filter based on the reference microphone signal and the error microphone signal, and
   adapting the feedback ANC filter based on the error microphone signal.

5. The method of claim 1 further comprising determining that the headset is being worn on a head of the user, wherein the selected ANC filter is adapted in response to determining that the headset is being worn.

6. The method of claim 5, wherein the selected ANC filter are only adapted while the headset is worn on the head of the user.

7. The method of claim 1 further comprising:
   obtaining an input audio signal containing program audio;
   selecting an equalization (EQ) filter based on the identified cushion; and
   generating a filtered input audio signal by filtering the input audio signal with the EQ filter,
   wherein driving the speaker comprises driving the speaker with a combination of the filtered input audio signal and the anti-noise signal.

8. The method of claim 7, wherein the combination is a first combination and the error microphone signal is a first error microphone signal, wherein the method further comprises:
   identifying that a different cushion is coupled to the headset housing;
   selecting a different ANC filter and a different EQ filter based on the different identified cushion;
   generating 1) a different anti-noise signal by filtering the reference microphone signal with the different ANC filter and 2) a different filtered input audio signal by filtering the input audio signal with the different EQ filter;
   driving the speaker with a second combination of the different filtered input audio signal and the different anti-noise signal; and
   while the different EQ filter remains fixed, adapting the different ANC filter based on the reference microphone signal and a second error microphone signal produced by the error microphone of the headset.

9. An audio system comprising:
   a reference microphone and an error microphone;
   a headset that has a headset housing in which at least one speaker is integrated therein;
   a processor; and
   memory having instructions stored therein which when executed by the processor causes the audio system to identify a cushion that is coupled to the headset housing, select an active noise cancellation (ANC) filter based on the identified cushion,
generate an anti-noise signal by filtering a reference microphone signal produced from the reference microphone with the ANC filter,
drive the speaker with the anti-noise signal, and
adapt the selected ANC filter based on the reference microphone signal and an error microphone signal produced by the error microphone.

10. The audio system of claim 9, wherein the ANC filter is a feedforward ANC filter and the anti-noise signal is a first anti-noise signal, wherein the memory has further instructions to
select a feedback ANC filter based on the identified cushion;
generate a second anti-noise signal by filtering the error microphone signal with the feedback ANC filter; and
drive the speaker with a combination of the first anti-noise signal and the second anti-noise signal.

11. The audio system of claim 10, wherein the feedback ANC filter remains fixed while the selected feedforward ANC filter is adapted.

12. The audio system of claim 10, wherein the instructions to adapt the selected ANC filter comprises instructions to
adapt the feedforward ANC filter based on the reference microphone signal and the error microphone signal, and
adapt the feedback ANC filter based on the error microphone signal.

13. The audio system of claim 9, wherein the memory has further instructions to determine that the headset is being worn on a head of the user, wherein the selected ANC filter is adapted in response to determining that the headset is being worn.

14. The audio system of claim 13, wherein the selected ANC filter is only adapted while the headset is worn on the head of the user.

15. The audio system of claim 9, wherein the memory has further instructions to obtain an input audio signal containing program audio;
select an equalization (EQ) filter based on the identified cushion; and
generate a filtered input audio signal by filtering the input audio signal with the EQ filter,
wherein driving the speaker comprises driving the speaker with a combination of the filtered input audio signal and the anti-noise signal.

16. The audio system of claim 15, wherein the combination is a first combination and the error microphone signal is a first error microphone signal, wherein the memory has further instructions to
identify that a different cushion is coupled to the headset housing;
select a different ANC filter and a different EQ filter based on the different identified cushion;
generate 1) a different anti-noise signal by filtering the reference microphone signal with the different ANC filter and 2) a different filtered input audio signal by filtering the input audio signal with the different EQ filter;
drive the speaker with a second combination of the different filtered input audio signal and the different anti-noise signal; and
while the different EQ filter remains fixed, adapt the different ANC filter based on the reference microphone signal and a second error microphone signal produced by the error microphone.

17. A method performed by an audio system that includes a headset that comprises a reference microphone that is arranged to capture sounds of an ambient environment in which a user wearing the headset is located as a reference microphone signal, the method comprising:
identifying a cushion that is coupled to a headset housing of the headset in which a speaker is integrated therein;
selecting an ambient sound enhancement (ASE) filter based on the identified cushion;
generating a filtered signal by filtering a reference microphone signal produced from a reference microphone of the headset in which at least one sound of the ambient environment is selectively attenuated; and
driving the speaker with the filtered signal to cause the speaker to reproduce at least a portion of the sounds of the ambient environment.

18. The method of claim 17 further comprising:
obtaining an input audio signal containing program audio;
selecting an equalization (EQ) filter based on the identified cushion;
generating a filtered input audio signal by filtering the input audio signal with the EQ filter; and
driving the speaker with a combination of the filtered input audio signal and the filtered signal.

19. The method of claim 18, wherein the combination is a first combination, wherein the method further comprises:
selecting a feedback ANC filter based on the identified cushion;
generating an anti-noise signal by filtering the reference microphone signal with the feedback ANC filter; and
driving the speaker with a second combination of the filtered input audio signal, the filtered signal, and the anti-noise signal.

20. The method of claim 19 further comprising determining that the headset is being worn on a head of the user, wherein the EQ filter, the ASE filter, and the feedback ANC filter remain fixed while the headset is worn on the head of the user.

21. The method of claim 18, wherein the combination is a first combination and the cushion is a first cushion, wherein the method further comprises:
identifying that a second cushion that is different than the first cushion is coupled to the headset housing;
selecting a different ASE filter and a different EQ filter based on the second cushion;
generating 1) a different filtered signal by filtering the reference microphone signal with the different ASE filter and 2) a different filtered input audio signal by filtering the input audio signal with the different EQ filter; and
driving the speaker with a second combination of the different filtered input audio signal and the different filtered signal.

22. The method of claim 21,
wherein the first cushion forms a first front volume while the first cushion is coupled to the headset housing and the headset is worn by the user, and the second cushion forms a second front volume while the second cushion is coupled to the headset housing and the headset is worn by the user,
wherein sound within the first front volume while the speaker drives the first combination has at least one sound characteristic that is the same as a corresponding sound characteristic of sound within the second front volume while the speaker drives the second combination.

* * * * *